United States Patent [19]

Kaneko et al.

[11] 4,259,743
[45] Mar. 31, 1981

[54] TRANSMIT/RECEIVE MICROWAVE CIRCUIT

[75] Inventors: Yoichi Kaneko, Tokorozawa; Kenji Sekine, Hinodemachi; Eiichi Hase, Hachioji; Akira Endo, Katsuta, all of Japan

[73] Assignee: Hitachi, Ltd., Japan

[21] Appl. No.: 965,699

[22] Filed: Dec. 1, 1978

[30] Foreign Application Priority Data

Dec. 9, 1977 [JP] Japan .................. 52/164615[U]

[51] Int. Cl.³ .................. H04B 1/54; G01S 13/60
[52] U.S. Cl. .................. 455/81; 333/247; 333/250; 343/5 DD
[58] Field of Search .............. 333/246, 247, 238, 250, 333/103, 104; 343/5 DD, 7 VM, 8; 325/445, 446; 455/81, 326, 327

[56] References Cited

U.S. PATENT DOCUMENTS

| | | | |
|---|---|---|---|
| 2,832,885 | 4/1958 | Brett | 333/250 X |
| 3,066,290 | 11/1962 | Whitehorn | 325/446 X |
| 3,512,091 | 5/1970 | Blixt et al. | 325/446 |
| 3,768,025 | 10/1973 | Hreha | 333/103 X |
| 3,882,396 | 5/1975 | Schneider | 333/250 X |
| 4,122,449 | 10/1978 | Endo | 333/116 X |

Primary Examiner—Paul L. Gensler
Attorney, Agent, or Firm—Craig & Antonelli

[57] ABSTRACT

A microwave integrated circuit device for use in the transmitting and receiving portion of a Doppler speedometer utilizing microwaves. In order to keep the transmitting power low and the receiving sensibility high, a microwave integrated circuit plate in which a transmitting antenna line and lines for connecting mixer diodes therewith are arranged at right angles is mounted within a rectangular waveguide and in the vicinity of a short-circuit plate of the waveguide in a manner to lie at right angles with the electric field of the waveguide.

5 Claims, 4 Drawing Figures

TRANSMIT/RECEIVE MICROWAVE CIRCUIT

BACKGROUND OF THE INVENTION (1) Field of the Invention

This invention relates to a microwave circuit device, and more particularly to a circuit device in which a microwave integrated circuit is installed within a microwave waveguide device including a rectangular waveguide, a horn antenna, etc.

(2) Description of the Prior Art

As a device for measuring a velocity or for detecting an obstacle and carried on an automobile, there has been considered the Doppler radar which makes use of microwaves.

Such a device requires a rectangular waveguide, a horn antenna etc. for transmitting and receiving the microwaves. In order to miniaturize the device, a circuit for the transmission and reception put into the form of a microwave integrated circuit is assembled in the waveguide.

In devices such as the radar which radiate the microwaves, the transmission power needs to be kept at a very low level (below 1 $\mu$W) in view of influences on other wireless equipment. On the other hand, the receiving sensitivity needs to be made as high as possible.

Further, in the actual installation, this type of device requires the control of leaky electric power or the reduction of noise generated in a local oscillator and appearing in a signal output.

SUMMARY OF THE INVENTION

An object of this invention is to provide a microwave circuit device in which a microwave integrated circuit capable of making the transmitting power low and the receiving sensibility high is installed within a rectangular waveguide.

Another object of this invention is to provide a microwave circuit device which can control the leaky electric power, i. e., the output signal level and reduce noise generated in a local oscillator and appearing in the signal output.

In order to accomplish the objects, this invention consists of a microwave circuit device wherein a microwave integrated circuit is installed within a rectangular waveguide (including a feeder for a horn antenna), characterized in that a line which forms a transmitting antenna portion to be constructed in a microwave integrated circuit and which supplies a local oscillation signal is arranged in a direction orthogonal to an electric field of the rectangular waveguide and that mixer diodes are arranged in parallel with the electric field.

In the microwave integrated circuit device according to this invention, the transmitting power has its magnitude determined by the balance of the local oscillation signal applied to the two mixer diodes and can therefore be suppressed to a very low signal level. A receiving signal is applied to the mixer diodes and their connection lines which are arranged in parallel with the electric field of the waveguide, so that a high receiving sensibility can be attained.

The above-mentioned and other objects and features of this invention will become more apparent from the following description taken in conjunction with the drawings.

DESCRIPTION OF THE PREFERRED EMBODIMENTS

Figure 1A:
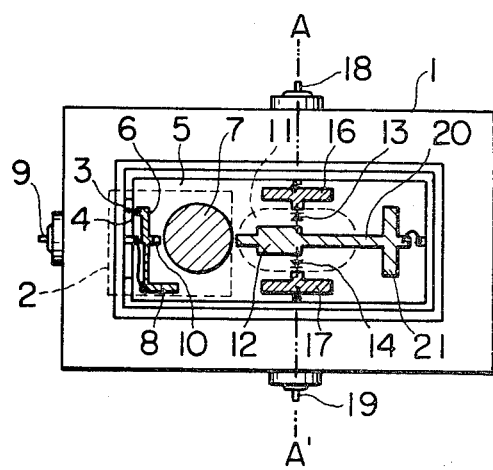
FIGS. 1A and 1B are a plan view and a side sectional view of an embodiment of a microwave circuit device according to this invention, respectively.
Figure 1B:
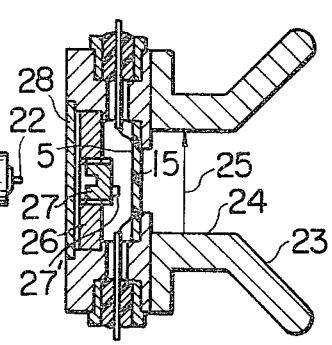

FIGS. 1A and 1B are a plan view and a side sectional elevation showing the construction of a microwave integrated circuit device embodying this invention, respectively. The illustrated device is used for the transmitting and receiving portion of a Doppler radar. Referring to the figures, a local oscillation port 2 of a Doppler radar module 1 is made up of a Gunn diode 3, a bonding wire 4, a quarter-wavelength micro strip line 6 formed on a substrate or circuit plate 5, a circular resonator 7, a bias circuit with a low-pass filter 8, a D. C. bias terminal 9, and a resistor 10 for suppressing undesirable modes. FIG. 1A shows the structure of FIG. 1B as viewed from the left-hand side with parts 27, 27', 26 and 28 omitted therefrom, while FIG. 1B shows a section taken along A—A' in FIG. 1A.

An oscillation signal power from the circular resonator 7 is applied to mixer diodes 13 and 14 through a coplanar line 12 for entering local oscillation in a mixer part 11.

In the micro integrated plate, a metallic plate as an earth electrode is stuck on its rear surface which is usually a dielectric material plane. As indicated by a broken-line part in the mixer part 11, the rear surface conductor is partially taken off, and a dielectric window 15 for passing transmitted and received microwaves is formed. Output signals from the mixers 13 and 14 are derived from output terminals 18, 19 and 22 via straps functioning as low pass filter 16, 17 and 21, respectively. A lead line 20 connects the terminal 22 with the connecting point of the two mixer diodes 13 and 14. In the present embodiment, lead line 12 connected between oscillation signal part 2 and the connecting point of mixer diodes 13 and 14 is mounted on circuit plate 5 in a manner to intersect orthogonally a line formed by mixer diodes 13 and 14 and their lead line. The front surface of the circuit plate 5, on which mixers 13 and 14 and strip line such as 12, 20 are mounted, faces the short-circuit plate formed by metal plates 26 and 28 at a predetermined distance.

The rear surface of the circuit plate faces the opening of the rectangular waveguide 24, and a metal plate of the rear surface of the portion 11 corresponding to the mixer diodes is removed so as to form a dielectric window 15.

Thus, the coplanar line or lead line 12 connected between an oscillation signal part 2 and the connecting point of diodes 13 and 14 is arranged at a right angle to the direction of electric field 25 of the microwaves in a waveguide 24 with a horn antenna 23. Accordingly, the amount of leak signal of the microwaves propagated into the antenna or opening 24 is determined by the unbalance of diodes 13 and 14, and is extremely small.

On the other hand, the mixer diodes 13 and 14 including their lead lines are collinearly arranged parallel to the direction of the electric field 25 and provide good coupling with the received waves from the waveguide part 24. The field of the rectangular waveguide is is parallel to the minor axis of the rectangular waveguide. The transmitting power of the radar module 1 is determined by the unbalance of the mixer diodes 13 and 14 attributed to the variation of their characteristics, and the deviation from the condition of orthogonal intersection, of the angle of the coplanar line 12 or lead line 20 relative to the microwave field 25. According to an experimental result, when the local oscillation input was 1 mW, the leakage power could be made less than 1 μW by adjusting the mounting angle of the module 1 on the waveguide part 24. Thus, with the present embodiment, all the principal leaky waves are in-phase or anti-phase, and the electric power can be controlled by adjusting the quantity of leakage from the local oscillation input line.

As another means for facilitating power control, the radar module 1 comprises a supporting plate 26 (which forms the short-circuit plate of the waveguide) and an asymmetric screw 27. By turning the screw 27 the balance of the coplanar line 12 or lead line 20 as to the local oscillation input power is changed, thereby making the adjustment of the quantity of leakage easier. The asymmetry is attained by forming a protuberance 27' at a position distant from the center of an end face of the screw 27. After the adjustment with the screw 27, the radar module 1 is hermetically sealed by a rear plate 28.

Local oscillation noise detected by the mixer diodes 13 and 14 have their amplitudes equalized and are added in the opposite phases by a suitable processing circuit, whereby 20 to 30 dB can be suppressed irrespective of the variation of the characteristics of the diodes. Such a processing circuit can be constructed of resistors in a simple case, but the leakage powers from the mixers change more or less due to the variations of the resistances. With the circuit device of the present embodiment, however, such noise suppression and the power control can be executed by the substantially independent means, and hence, low transmitting power and high-sensibility receiving characteristics as desired can be realized.

Figure 2A:
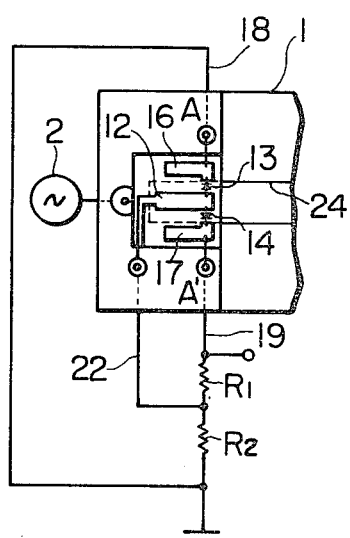
FIGS. 2A and 2B are a sectional view and a sectional plan view of another embodiment of a microwave circuit device according to this invention, respectively.
Figure 2B:
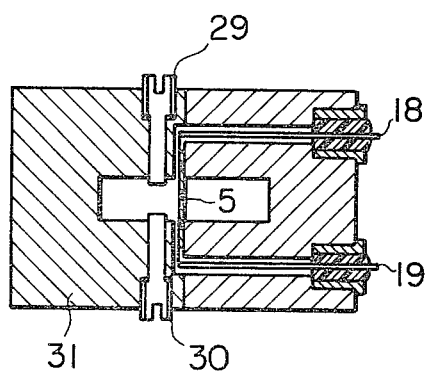

FIGS. 2A and 2B are a side view and a sectional view showing the construction of another embodiment of a microwave circuit device according to this invention, respectively.

FIG. 2A shows a side surface at an end of a rectangular waveguide, that is, the structure of FIG. 2B as viewed from the left-hand side with a side part 31 removed therefrom, while FIG. 2B shows a section A—A' perpendicular to the axis of the waveguide. This embodiment is also a module of the transmitting and receiving portion of a Doppler radar to be carried on an automobile.

In FIGS. 2A and 2B, parts assigned the same numerals as in FIGS. 1A and 1B are the same or corresponding circuit elements, and the detailed description is omitted. In this embodiment, the microwave integrated circuit plate 5 is arranged in parallel with the axial direction of the waveguide 24 and situated on a short circuit plate and extending perpendicularly therefrom. The oscillation part 2 is disposed outside the waveguide. In this case, the adjustment of the quantity of leakage of the local oscillation power is carried out with two adjusting screws 29 and 30 which are arranged in proximity to and in parallel with the coplanar line 12.

In this case where the polarities of the mixer diodes 13 and 14 are located symmetrically with respect to the coplanar line 12, a noise suppressing circuit is constructed of resistors $R_1$ and $R_2$ as shown in FIG. 2A. By varying the resistances of the resistors $R_1$ and $R_2$, the detection currents of the respective diodes can be made equal. Under this circuit condition, the local oscillation noise can be eliminated. At this time, the detected signals are added, and an output voltage which is twice as great as the output voltage of one diode is obtained.

We claim:

1. A transmit/receive microwave circuit device comprising:
   a rectangular waveguide with an opening at one end thereof and a short-circuit plate at a second end thereof and propagating a singly polarized electric field;
   a microwave integrated circuit plate on which two mixer diodes and lead lines connected to said diodes are collinearly arranged and which a lead line connected between an oscillation signal part and a connecting point of said two mixer diodes is arranged at a right angle to said two mixer diodes collinearly arranged,
   and said microwave integrated circuit plate is installed at said second end end of said waveguide in such a manner that said lead line connected between the oscillation signal part and said connecting point of said mixer diodes is at a right angle to a direction of said electric field and that said mixer diodes and their lines collinearly arranged are parallel to the direction of said electric field in said waveguide.

2. A microwave circuit device according to claim 1, wherein a front surface of said microwave integrated circuit plate, on which said mixer diodes are mounted, faces said short-circuit plate of said waveguide, the rear surface of said circuit plate faces the opening of the waveguide, and a portion of said rear surface corresponding to a respective one of said mixer diodes and said lead line connected between said oscillation part and said connecting point of the mixer diode is made of a dielectric material.

3. A microwave circuit device according to claim 2, wherein a screw for controlling a balance of electric fields applied to said mixer diodes is mounted on said short-circuit plate.

4. A microwave circuit device according to claim 1, wherein said microwave integrated circuit plate is mounted in such a position that a plane of said plate is parallel with an axis of said waveguide.

5. A microwave circuit device according to claim 4, wherein said device further comprises at least one screw which is arranged in parallel with the microwave integrated plate through a side wall of the waveguide.

* * * * *